(12) United States Patent
Van Der Laan et al.

(10) Patent No.: US 7,663,741 B2
(45) Date of Patent: Feb. 16, 2010

(54) LITHOGRAPHIC APPARATUS, DEVICE MANUFACTURING METHOD, CALIBRATION METHOD AND COMPUTER PROGRAM PRODUCT

(75) Inventors: Hans Van Der Laan, Veldhoven (NL); Christian Wagner, Eersel (NL)

(73) Assignee: ASML Netherlands B.V., Veldhoven (NL)

( * ) Notice: Subject to any disclaimer, the term of this patent is extended or adjusted under 35 U.S.C. 154(b) by 892 days.

(21) Appl. No.: 10/929,882

(22) Filed: Aug. 31, 2004

(65) Prior Publication Data

US 2006/0046165 A1    Mar. 2, 2006

(51) Int. Cl.
 *G01B 9/00* (2006.01)
 *G03B 27/32* (2006.01)
 *G03C 5/00* (2006.01)
(52) U.S. Cl. ............................. 356/124; 430/30; 355/77
(58) Field of Classification Search .................. None
 See application file for complete search history.

(56) References Cited

U.S. PATENT DOCUMENTS

| | | | | |
|---|---|---|---|---|
| 5,362,585 A * | 11/1994 | Adams | .................. | 430/30 |
| 5,631,731 A * | 5/1997 | Sogard | .................. | 356/121 |
| 5,976,740 A * | 11/1999 | Ausschnitt et al. | ............ | 430/30 |
| 6,646,729 B2 * | 11/2003 | van der Laan et al. | ...... | 356/124 |
| 6,741,331 B2 * | 5/2004 | Boonman et al. | ............. | 355/67 |
| 7,293,249 B2 * | 11/2007 | Torres Robles et al. | ........ | 716/8 |
| 2002/0019729 A1 * | 2/2002 | Chang et al. | ................... | 703/6 |
| 2002/0041377 A1 * | 4/2002 | Hagiwara et al. | ........... | 356/399 |
| 2004/0140418 A1 * | 7/2004 | Ye et al. | .................. | 250/208.1 |
| 2004/0228515 A1 * | 11/2004 | Okabe et al. | ................. | 382/145 |

* cited by examiner

*Primary Examiner*—Gregory J Toatley, Jr.
*Assistant Examiner*—Gordon J Stock, Jr.
(74) *Attorney, Agent, or Firm*—Pillsbury Winthrop Shaw Pittman LLP

(57) ABSTRACT

To calibrate a lithographic apparatus contrast in the aerial image is measured for a plurality of different settings of available manipulators of the projection system. Appropriate settings of the manipulators are determined as those giving the maximum contrast values.

19 Claims, 3 Drawing Sheets

LITHOGRAPHIC APPARATUS, DEVICE MANUFACTURING METHOD, CALIBRATION METHOD AND COMPUTER PROGRAM PRODUCT

FIELD

The present invention relates to a lithographic projection apparatus, a method for manufacturing a device, and a method of calibrating a lithographic projection apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

When a projection system is used to transfer the pattern onto the substrate, any aberrations in the projection system will affect the projected image and should be minimized. A perfect projection system cannot be made so most projection systems are provided with adjustment "knobs" which control the position and/or orientation of one or more optical elements in the projections system, e.g. lens or mirrors. Adjustment of these knobs affects the projected image, either by increasing or reducing aberrations. When the apparatus is set up, and when maintenance is required, wavefront aberrations in the projected image are measured and the knobs of the projection system adjusted to minimize these.

This is not a straight forward procedure: it requires a mathematical model or simulation of the projection system to link the measured wavefront errors to the available control knobs. It is convenient to describe aberrations and wavefront errors in terms of Zernike polynomials and these are generally used for the input to the model of the projection system. However, determination of the values of individual Zernike polynomials is not always possible as it generally requires an interferometer built into the apparatus, which is not always available. Also, some measurement techniques have difficulty in distinguishing between aberrations of the same type, but different order.

SUMMARY

It is desirable to have an improved method of calibrating a projection system of a lithographic apparatus.

According to an aspect of the invention, there is provided a lithographic projection apparatus arranged to project a pattern from a patterning device onto a substrate using a projection system, and including a sensor arranged to measure contrast in the aerial image projected by said projection system, a controller responsive to contrast values measured by said sensor and connected to manipulators for adjusting one or more elements of the projection system, said controller being arranged to adjust elements of the projection system to maximize contrast in the aerial image.

According to another aspect of the invention, there is provided a device manufacturing method including projecting a patterned beam of radiation onto a substrate using a projection system, the method including measuring contrast in the aerial image projected by said projection system, and adjusting one or more elements of the projection system on the basis of the measured contrast values to maximize contrast in the aerial image.

According to yet another aspect of the invention, there is provided a method of calibrating a lithographic projection apparatus having a projection system provided with one or more manipulators for adjusting the position and/or orientation of elements of the projection system, the method including projecting an aerial image, measuring the contrast in the aerial image at a plurality of positions in each of a plurality of planes perpendicular to and at different positions along the optical axis of the projection system, repeating the projection and measurement for a plurality of settings of the one or more manipulators, and determining settings of the one or more manipulators to provide the maximum contrast in the aerial image on the basis of the measured contrast values.

According to still another aspect of the invention, there is provided a machine readable medium including machine executable instructions for calibrating a lithographic projection apparatus having a projection system provided with one or more manipulators for adjusting the position and/or orientation of elements of the projection system, the instructions including instructions for performing a method including projecting an aerial image, measuring the contrast in the aerial image at a plurality of positions in each of a plurality of planes perpendicular to and at different positions along the optical axis of the projection system, repeating the projection and measurement for a plurality of settings of the one or more manipulators, and determining settings of the one or more manipulators to provide the maximum contrast in the aerial image on the basis of the measured contrast values.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
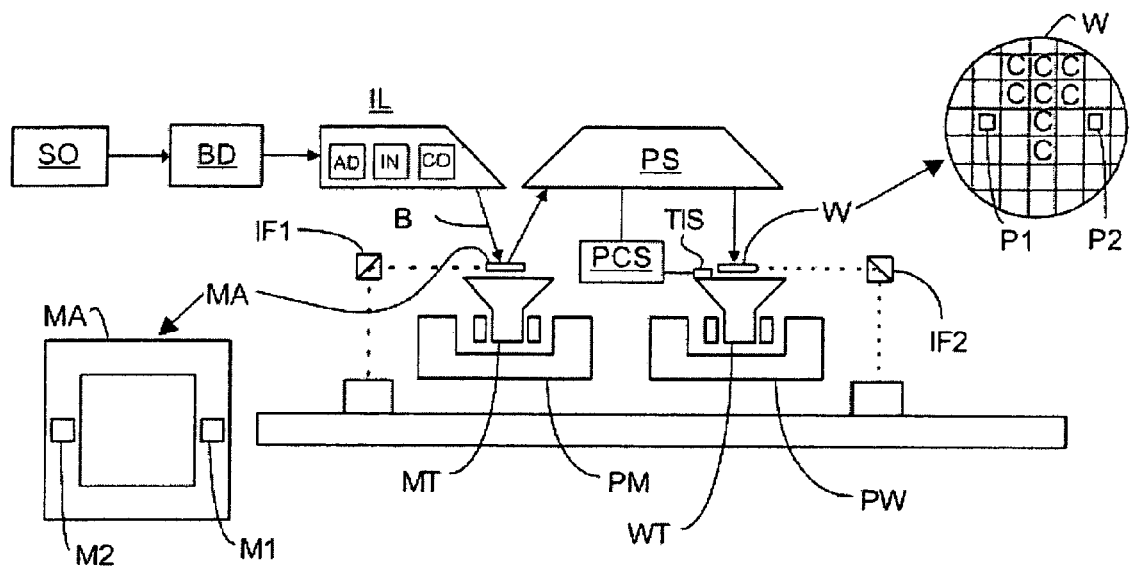
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The substrate table WT also carries an image sensor, such as a transmission image sensor TIS, which is used to measure properties of the aerial image projected by the projection system PS. The image sensor comprises a photo-detector covered by an opaque layer in which there is one or more slits of known width. The slit can be scanned through the aerial image under the control of the positioner PW to obtain a measure of the image intensity as a function of position in three dimensions. Among other things, this can be used to find the plane of best focus of the projected image. Where the exposure radiation is of short wavelength, e.g. EUV, the image sensor may comprise a layer of luminescent material underneath the opaque layer, which emits relatively long wavelength light when excited by short wavelength light and a photodetector that is sensitive to the relatively long wavelength light. Other forms of image sensor, such as a reflection image sensor may also be used.

In an embodiment of the invention, the output of the image sensor TIS is coupled to a projection control system PCS which in turn is coupled to available manipulators of the projection system PL. As discussed below, the projection control system adjusts the position and/or orientation of one or more elements of the projection system, using the available manipulators or "knobs", to optimize the aerial image projected by the projection system. The projection control system may be part of the overall control system of the lithographic apparatus and may be implemented by suitable computer software executed by a computer system or work station. Optimization may be carried out at system set up and periodically thereafter or in the event of a reduction in image quality.

The basic principle of the present invention is that the projection system PS is adjusted to maximize the contrast in the aerial image. This can be achieved by using the image sensor TIS to measure contrast, directly or indirectly, at the plane of best focus for the structure for which the optimization was performed for a range of values of a given control knob of the projection system. The position of that knob that gives the highest contrast is regarded as optimum. It should be noted that the setting giving the highest contrast may not give the lowest wavefront error but nevertheless will provide the best image in the plane of best focus.

The adjustment may be made for each available manipulator of the projection system. However under certain conditions, it is preferable to group the available manipulators in linear combinations to form virtual control knobs that are orthogonal to each other. Two virtual or real knobs are considered orthogonal if adjustment of one affects different aberrations than adjustment of the other. A real or virtual control knob may affect the values of one or more Zernike polynomials. The invention is particularly applicable in lithographic apparatus utilizing EUV radiation as the exposure radiation. In such an apparatus, the projection system will be formed of mirrors, e.g. formed by multilayer stacks. A control knob for such a projection system may alter the position and/or orientation of one or more mirrors. In particular, it is desirable to set up virtual knobs which cause adjustments of the positions and/or orientations of several mirrors in predetermined proportions. Such virtual knobs can be defined to induce aberrations corresponding to specific Zernike polynomials, e.g. Z7 coma. The present invention is particularly effective for adjustment of aberrations corresponding to Zernike polynomials Z5 and higher.

Figure 2:
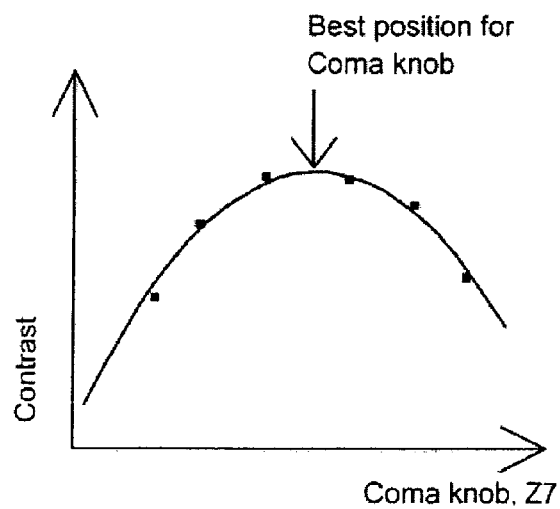
FIG. 2 is a graph of contrast vs. induced coma illustrating a principle of the present invention.

To determine an optimum setting of a given knob, a series of measurements of contrast at different settings of the knob is made. The optimum setting can be determined as the setting that gives the highest contrast or a mathematical fitting process, e.g. a parabolic fit, can be used. FIG. 2 shows contrast values for a series of settings of a knob affecting coma (Z7) a parabola is fitted to those data points using conventional techniques and the location of the maximum of the parabola gives the optimum position of the coma knob. As introduction of aberration may affect the Z position of the plane of best focus, so alternately, contrast can be measured at a plurality of different Z positions for each setting of the control knob and use the measurements at the level showing highest contrast. Settings for multiple knobs may be determined by fitting a multi-dimensional surface to measurements of contrast at different settings of the different knobs and finding the maximum of the multi-dimensional surface. Alternatively the orthogonal knobs may be optimized one after another.

As a measure of contrast, the Strehl ratio may be used. The Strehl ratio is defined as the ratio of the peak image irradiance with aberrations to the peak image irradiance without aberrations, assuming a point-like object. In a lithographic context, contrast can be measured using an image of a narrow slit, an isolated line or a group of dense lines. It is desirable to use a structure identical or comparable to the most critical lithographic structure in an intended process. The structure used to measure contrast may also depend on the control knob, and the Zernike aberrations it affects. For example, where Z5 is affected, lines at 45° and 135° should be used but for Z6, horizontal (0°) and vertical (90°) lines should be used. For Z7 vertical lines and for Z8 horizontal lines should be used. It will be appreciated that the mentioned line orientations apply to both the pattern on the mask and the slits in the detector.

Figure 3:
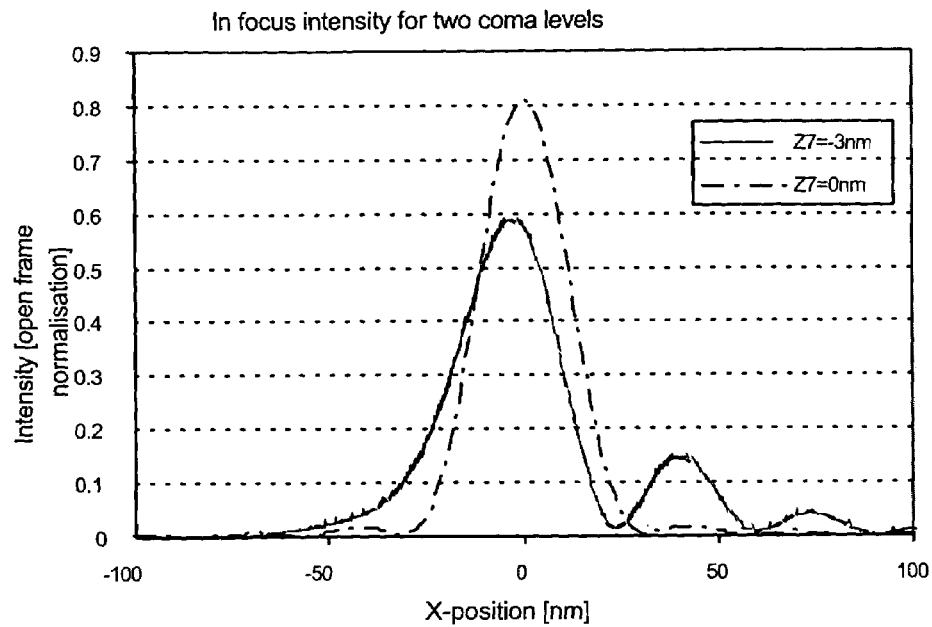
FIG. 3 is a graph of in focus intensity of an aerial image of a narrow slit for two coma levels
Figure 4:
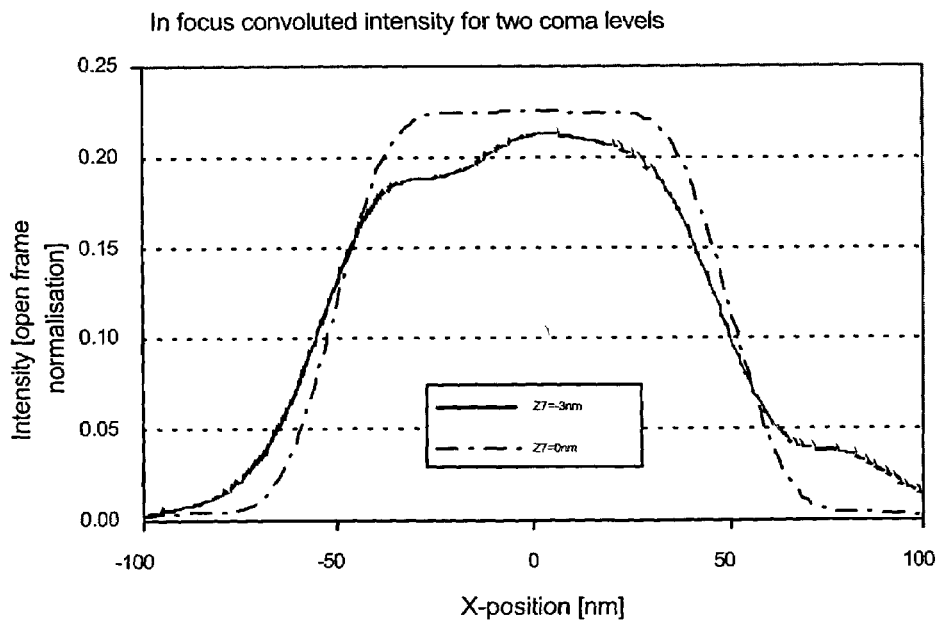
FIG. 4 is a graph of in focus intensity of an aerial image of a narrow slit convoluted with a detection slit.

If the image sensor TIS used to measure contrast has a slit with a width, e.g. 100 nm, greater than the width of the image whose contrast is to be measured, e.g. a 30 nm line, a direct measurement of the Strehl ratio cannot be made. This is shown in FIGS. 3 and 4. FIG. 3 is a graph showing normalized in focus intensity with X-position of an image of a 30 nm isolated space for two values of coma. FIG. 4 shows the same image but convoluted with a 100 nm slit and is effectively the output of the image sensor TIS scanned through the image. A much reduced difference in peak intensity is seen.

Figure 5:
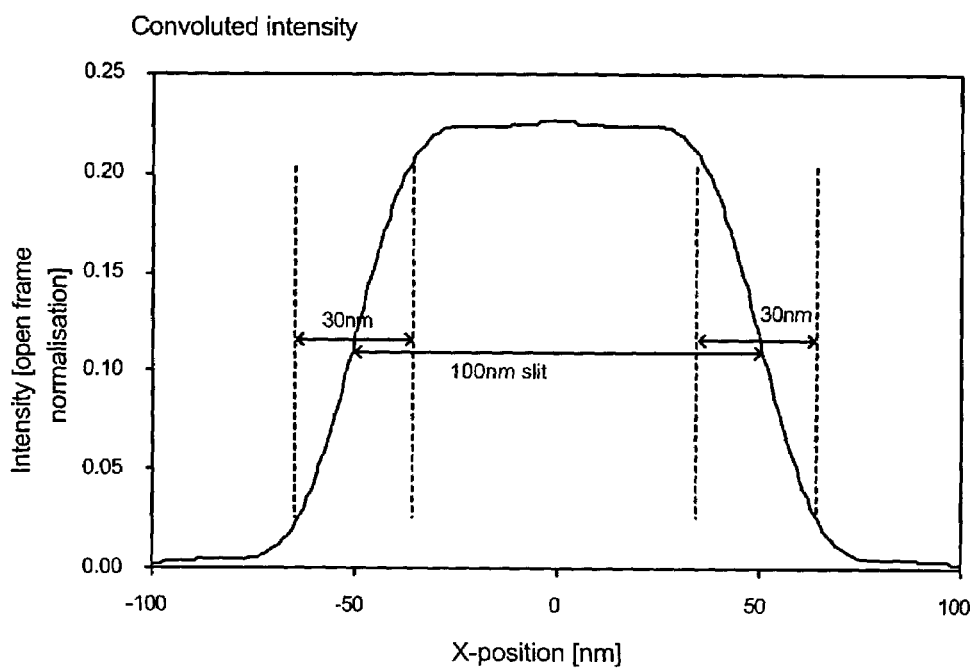
FIG. 5 is a graph showing slope measurement ranges in a method of an embodiment of the invention.
Figure 6:
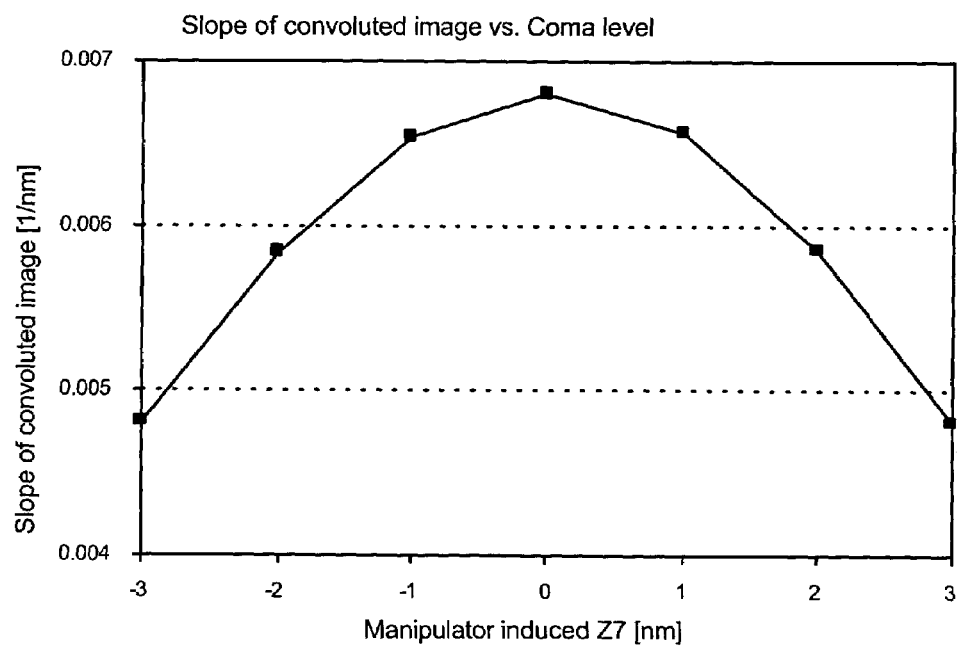
FIG. 6 is a graph of slope of convoluted intensity vs. coma level.

To more easily derive the optimum setting of the control knob, the slope of the measured (convoluted) intensity can be used. As shown in FIG. 5, the slope of the measured intensity is determined over two windows equal in width to the feature used for the measurement, in this example 30 nm, and having their centers separated by the width of the slit of the image sensor, in this example 100 nm. The absolute values of the slopes of the two windows are averaged. This is done for a plurality of different settings of each control knob. The optimum setting of the control knob can be determined by fitting a parabola to these values and locating the maximum of the curve, as shown in FIG. 6 for some example coma settings.

It will be appreciated that there is not a single unique definition of the Zernike polynomials which may be expressed in various different orders and with different normalization coefficients. Where Zernike polynomials are referred to herein by number, the following definitions are meant. However, different normalization coefficients may be used and the equivalent polynomials may be referred to by different numbers.

Z2 (tilt in X): $r \cdot \cos(\theta)$

Z3 (tilt in Y): $r \cdot \sin(\theta)$

Z4 (defocus): $2 \cdot r^2 - 1$

Z5 (astigmatism HV): $r^2 \cdot \cos(2 \cdot \theta)$

Z6 (astigmatism 45°/135°): $r^2 \cdot \sin(2 \cdot \theta)$

Z7 (coma X): $(3 \cdot r^3 - 2 \cdot r) \cdot \cos(\theta)$

Z8 (coma Y): $(3 \cdot r^3 - 2 \cdot r) \cdot \sin(\theta)$

Z9 (spherical aberration): $6 \cdot r^4 - 6 \cdot r^2 + 1$

Z12 (astigmatism HV—higher order): $(4 \cdot r^4 - 3 \cdot r^2) \cdot \cos(2 \cdot \theta)$ Z13 (astigmatism 45°/135°—higher order): $(4 \cdot r^4 - 3 \cdot r^2) \cdot \sin(2 \cdot \theta)$ Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus arranged to project a pattern from a patterning device onto a substrate using a projection system, and comprising:
    a sensor arranged to measure contrast in an aerial image projected by said projection system; and
    a controller responsive to contrast values measured by said sensor and connected to a manipulator configured to adjust one or more elements of the projection system, said controller being arranged to adjust the one or more elements of the projection system to maximize contrast in the aerial image.

2. Apparatus according to claim 1 wherein said controller is adapted to determine an optimum setting for one or more manipulators or one or more virtual controls by fitting a curve or surface using contrast values measured for a plurality of settings of the one or more manipulators or controls and finding a maximum of the curve or surface.

3. Apparatus according to claim 1 wherein said projection system is a mirror system having a peak of transmissivity in a wavelength range of substantially 5 to 20 nm.

4. Apparatus according to claim 1 further comprising a positioner arranged to position the sensor at a plurality of positions in three dimensions.

5. Apparatus according to claim 1 wherein said sensor is an image sensor.

6. Apparatus according to claim 1 wherein the controller is arranged to adjust a virtual control, whereby changes in the virtual control effect changes in a plurality of actual manipulators connected to the projection system in predetermined amounts.

7. Apparatus according to claim 4 wherein the sensor is mounted on a substrate table and the positioner is a positioner configured to position the substrate table.

8. Apparatus according to claim 5 wherein the image sensor is a transmission image sensor.

9. Apparatus according to claim 6 wherein the controller is arranged to adjust a plurality of virtual controls, the plurality of virtual controls being mutually orthogonal.

10. A device manufacturing method comprising:
projecting a patterned beam of radiation onto a substrate using a projection system;
measuring contrast in an aerial image projected by said projection system; and
adjusting one or more elements of the projection system on the basis of measured contrast values to maximize contrast in the aerial image.

11. A method according to claim 10 wherein measuring contrast comprises measuring contrast values of the aerial image at a plurality of positions in each of a plurality of planes perpendicular to and at different positions along an optical axis of the projection system.

12. A method according to claim 10 wherein contrast is measured using a transmission image sensor.

13. A method according to claim 10 further comprising determining an optimum setting for one or more manipulators or virtual controls by fitting a curve or surface using contrast values measured for a plurality of settings of the one or more manipulators or virtual controls and finding a maximum of the curve or surface.

14. A method according to claim 10 wherein said projection system is a mirror system having a peak of transmissivity in a wavelength range of substantially 5 to 20 nm.

15. A method according to claim 10 wherein adjusting one or more elements comprises adjusting a virtual control, whereby changes in the virtual control effect changes in a plurality of actual manipulators connected to the projection system in predetermined amounts.

16. Apparatus according to claim 15 wherein adjusting a virtual control comprises adjusting a plurality of virtual controls, the plurality of virtual controls being mutually orthogonal.

17. A method of calibrating a lithographic projection apparatus having a projection system provided with one or more manipulators for adjusting a position and/or orientation of one or more elements of the projection system, the method comprising projecting an aerial image;
measuring contrast in the aerial image at a plurality of positions in each of a plurality of planes perpendicular to and at different positions along an optical axis of the projection system;
repeating the projection and measurement for a plurality of settings of the one or more manipulators; and
determining a setting of the one or more manipulators to provide maximum contrast in the aerial image on the basis of the measured contrast values.

18. A computer program product for calibrating a lithographic projection apparatus having a projection system provided with one or more manipulators for adjusting a position and/or orientation of one or more elements of the projection system, the computer program product including a computer readable storage medium comprising computer-executable code that when executed on a computer system instructs the computer system to control the lithographic projection apparatus to:
project an aerial image;
measure contrast in the aerial image at a plurality of positions in each of a plurality of planes perpendicular to and at different positions along an optical axis of the projection system;
repeat the projection and measurement for a plurality of settings of the one or more manipulators; and
determine settings of the one or more manipulators to provide maximum contrast in the aerial image on the basis of the measured contrast values.

19. A lithographic apparatus comprising:
an illumination system configured to condition a beam of radiation;
a support structure configured to support a patterning device, the patterning device serving to pattern the beam according to a desired pattern;
a substrate table configured to hold a substrate;
a projection system configured to project the patterned beam onto a target portion of the substrate;
a sensor arranged to measure contrast in an aerial image projected by said projection system; and
a controller responsive to contrast values measured by said sensor and connected to one or more manipulators configured to adjust one or more elements of the projection system, said controller being arranged to adjust one or more elements of the projection system to enhance contrast in the aerial image.

* * * * *